(12) United States Patent
Wen et al.

(10) Patent No.: US 11,610,953 B2
(45) Date of Patent: Mar. 21, 2023

(54) OLED WITH SUBPIXELS HAVING NON-EMITTING FILLING PART

(71) Applicant: BOE Technology Group Co., Ltd., Beijing (CN)

(72) Inventors: Mengyang Wen, Beijing (CN); Jianchao Zhu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 39 days.

(21) Appl. No.: 17/352,262

(22) Filed: Jun. 19, 2021

(65) Prior Publication Data
US 2022/0223663 A1 Jul. 14, 2022

(30) Foreign Application Priority Data
Jan. 13, 2021 (CN) .......................... 202110040446.7

(51) Int. Cl.
*H01L 27/32* (2006.01)

(52) U.S. Cl.
CPC ...... *H01L 27/3246* (2013.01); *H01L 27/3216* (2013.01); *H01L 27/3218* (2013.01)

(58) Field of Classification Search
CPC ............. H01L 27/3246; H01L 27/3216; H01L 27/3218
See application file for complete search history.

(56) References Cited

U.S. PATENT DOCUMENTS

| | | | |
|---|---|---|---|
| 2009/0309813 A1* | 12/2009 | Fujita | G09G 3/3611 345/55 |
| 2016/0028035 A1 | 1/2016 | Yang | |
| 2018/0033842 A1* | 2/2018 | Bae | H01L 27/3216 |
| 2018/0182814 A1* | 6/2018 | Kim | H01L 27/322 |
| 2018/0337217 A1* | 11/2018 | Zang | H01L 27/322 |
| 2020/0357868 A1 | 11/2020 | Cui | |

FOREIGN PATENT DOCUMENTS

| | | |
|---|---|---|
| CN | 103730584 A | 4/2014 |
| CN | 110164908 A | 8/2019 |
| CN | 111293152 A | 6/2020 |
| JP | 2011054513 A | 3/2011 |
| JP | 2012113934 A * | 6/2012 |
| WO | 2012132862 A1 | 10/2012 |

OTHER PUBLICATIONS

CN202110040446.7 first office action.

* cited by examiner

*Primary Examiner* — Peter Bradford
(74) *Attorney, Agent, or Firm* — IPro, PLLC

(57) ABSTRACT

Disclosed are a display substrate, an organic light-emitting diode display panel and a display device. The display substrate includes a base substrate and a pixel defining layer located on a side of the base substrate, wherein the pixel defining layer is provided with a plurality of sub-pixel openings, outer contour shapes and sizes of all the sub-pixel openings are the same, filling parts are arranged in at least parts of the sub-pixel openings, and for different sub-pixel openings, area ratios of the filling parts to the sub-pixel openings are different.

20 Claims, 3 Drawing Sheets

OLED WITH SUBPIXELS HAVING NON-EMITTING FILLING PART

CROSS REFERENCE TO RELATED APPLICATION

This application is based on and claims priority under 35 U.S.C. 119 to Chinese Patent Application No. 202110040446.7, filed on Jan. 13, 2021, in the China National Intellectual Property Administration. The entire disclosure of the above application is incorporated herein by reference.

FIELD

The disclosure relates to the technical field of display, in particular to a display substrate, an organic light-emitting diode display panel, and a display device.

BACKGROUND

For an organic light-emitting diode (OLED) display panel, a top-emitting structure is usually used to ensure that an aperture ratio is large enough. A color filter (CF) on EL (COE) structure is fabricated by forming a CF layer by lithography on a top-emitting OLED device encapsulated by thin-film encapsulation (TFE). It may be applied to flexible OLED products, which may reduce a total thickness of a display panel, thus improving bending resistance performance, and may significantly improve brightness and color gamut of the display panel.

However, color separation exists in the display products in the prior art.

SUMMARY

The disclosure provides a display substrate, an organic light-emitting diode display panel and a display device.

The embodiment of the disclosure provides the display substrate, including a base substrate and a pixel defining layer on a side of the base substrate. The pixel defining layer is provided with a plurality of sub-pixel openings, outer contour shapes and sizes of all the sub-pixel openings are the same, filling parts are provided inside at least parts of the sub-pixel openings, and for different sub-pixel openings, area ratios of the filling parts to the sub-pixel openings are different.

The embodiment of the disclosure further provides an organic light-emitting diode display panel, including a display substrate. The display substrate includes a base substrate and a pixel defining layer on a side of the base substrate. The pixel defining layer is provided with a plurality of sub-pixel openings, outer contour shapes and sizes of all the sub-pixel openings are the same, filling parts are provided inside at least parts of the sub-pixel openings, and for different sub-pixel openings, area ratios of the filling parts to the sub-pixel openings are different.

The embodiment of the disclosure further provides a display device, including the organic light-emitting diode display panel provided by the embodiment of the disclosure.

DETAILED DESCRIPTION OF THE EMBODIMENTS

In order to enable objectives, technical solutions and advantages of the embodiments of the disclosure clearer, a clear and complete description of the technical solutions of the embodiments of the disclosure will be given below in combination the accompanying drawings of the embodiments of the disclosure. Obviously, the embodiments described are part of the disclosure and not all of the embodiments. Based on the described embodiments of the disclosure, all other embodiments obtained by those of ordinary skill in the art without creative efforts are covered by the scope of protection of the disclosure.

Unless otherwise defined, technical terms or scientific terms used in this disclosure shall have the ordinary meaning understood by those of ordinary skill in the art to which this disclosure belongs. As used in this disclosure, "first", "second" and similar words do not indicate any order, quantity or importance, but are only used to distinguish different components. Similar words such as "include" or "comprise" mean that the elements or objects appearing before the word cover the listed elements or objects appearing after the word and their equivalents, but do not exclude other elements or objects. Similar words such as "connect" or "connected" are not limited to physical or mechanical connection, but may include electrical connection, whether direct or indirect. "Upper", "lower", "left" and "right" are only used to express the relative positional relationship. When the absolute position of the described object changes, the relative positional relationship may change accordingly.

In order to keep following descriptions of the embodiments of the disclosure clear and concise, detailed descriptions of known functions and known parts are omitted herein.

Figure 1:
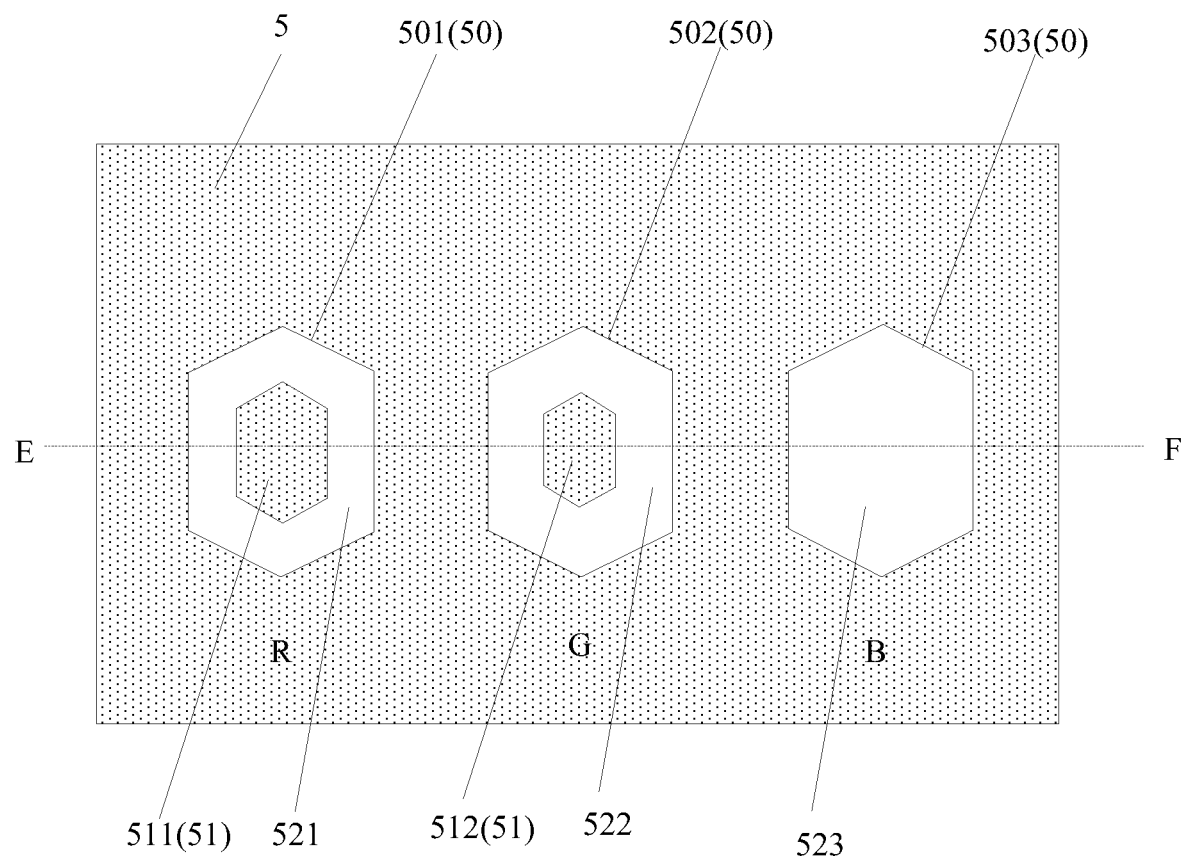
FIG. 1 is a schematic structural diagram of a top view of an array substrate provided by an embodiment of the disclosure.
Figure 2:
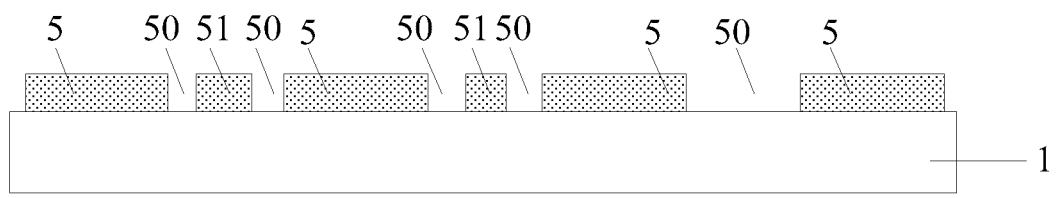
FIG. 2 is a schematic structural diagram of a section view of an array substrate provided by an embodiment of the disclosure.

As shown in FIG. 1 and FIG. 2, FIG. 2 is a schematic diagram of a section view of the structure in FIG. 1 along a dashed line EF. The embodiment of the disclosure provides the display substrate, including a base substrate 1 and a pixel defining layer 5 on a side of the base substrate 1. The pixel defining layer 5 is provided with a plurality of sub-pixel openings 50, for example, the sub-pixel openings may include red sub-pixel openings 501, green sub-pixel openings 502, and blue sub-pixel openings 503. Outer contour shapes and sizes of all the sub-pixel openings 50 are the same. In some embodiments, that the sizes are the same may be understood as opening lengths of all the sub-pixel openings 50 in all directions are the same. For example, in a horizontal direction in FIG. 1, lengths of all the sub-pixel openings 50 are the same, and in a vertical direction, lengths of all the sub-pixel openings 50 are also same. At least parts of the sub-pixel openings 50 are provided with filling parts 51. For example, the red sub-pixel openings 501 are provided with red filling parts 511, and the green sub-pixel openings 502 are provided with green filling parts 512. For different sub-pixel openings 50, area ratios of the filling parts 51 to the sub-pixel openings 50 are different. For example, an area ratio of the red filling parts 511 to the red sub-pixel openings 501 is larger than an area ratio of the green filling parts 512 to the green sub-pixel openings 502.

In the embodiment of the disclosure, the pixel defining layer 5 is provided with the plurality of sub-pixel openings 50, and the outer contour shapes and the sizes of all the sub-pixel openings 50 are the same, so a phenomenon of color separation due to a case that when the sizes and the shapes of the sub-pixel openings 50 are different (for example, red sub-pixels R are the narrowest along a panel gate line, and the green sub-pixels G are the narrowest along a panel data line), light enters through the sub-pixel openings 50 and is reflected by a lower film layer (for example, an anode), and then diffracts through the sub-pixel openings 50 again, can be improved. In addition, the filling parts 51 are arranged in at least parts of the sub-pixel openings 50, and for different sub-pixel openings 50, the area ratios of the filling parts 51 to the sub-pixel openings 50 are different, so corresponding color separation improvement may be carried out under a condition of keeping a life compensation effect without affecting normal light-emitting of pixels with different light emitting colors.

In some embodiments, combined with FIG. 1 and FIG. 2, for different sub-pixel openings 50, the area ratios are positively correlated with emitted light wavelengths corresponding to the sub-pixel openings 50. In some embodiments, for example, emitted light wavelengths corresponding to the red sub-pixel openings 501 are larger than emitted light wavelengths corresponding to the green sub-pixel openings 502, and emitted light wavelengths corresponding to the green sub-pixel openings 502 are larger than emitted light wavelengths corresponding to the blue sub-pixel openings 503, therefore, the area ratio of the red filling parts 511 to the red sub-pixel openings 501 is larger than the area ratio of the green filling parts 512 to the green sub-pixel openings 502, and the area ratio of the green filling parts 512 to the green sub-pixel openings 502 is larger than an area ratio of blue filling parts 513 (not shown in the drawing) to the blue sub-pixel openings 503 (in some embodiments, the blue sub-pixel openings 503 may be not provided with the filling parts 51). Because in present light-emitting materials, usually a light-emitting life of blue light-emitting materials is shorter than a light-emitting life of green light-emitting materials, a light-emitting life of the green light-emitting materials is shorter than a light-emitting life of red light-emitting materials, in the embodiment of the disclosure, for different sub-pixel openings 50, the area ratios are positively correlated with the emitted light wavelengths corresponding to the sub-pixel openings 50, an effective light-emitting area of the red sub-pixel openings 501 may be made to be larger than an effective light-emitting area of the green sub-pixel openings 502, the effective light-emitting area of the green sub-pixel openings 502 may be made to be larger than an effective light-emitting area of the blue sub-pixel openings 503, so that final light-emitting lives of all the sub-pixel openings 50 are ensured to be same. Of course, if the light-emitting lives of the red, green and blue light-emitting materials are different from a current light-emitting life law, a corresponding relationship between the filling parts 51 and the sub-pixel openings 50 may also be in other ways.

In some embodiments, only the red sub-pixel openings 501 and the green sub-pixel openings 502 may be provided with the filling parts 51. In the embodiment of the disclosure, only the red sub-pixel openings 501 and the green sub-pixel openings 502 are provided with the filling parts 51 inside, which may ensure that the final light-emitting lives of all the sub-pixel openings 50 are the substantively same, simplify a pattern of the pixel defining layer 5, and reduce the difficulty of manufacturing the pixel defining layer 5.

In some embodiments, areas in the red sub-pixel openings 501 except the filling parts 51 are regarded as red effective light-emitting areas 521, areas in the green sub-pixel openings 502 except the filling parts 51 are regarded as green effective light-emitting areas 522, and the blue sub-pixel openings 503 are regarded as blue effective light-emitting areas 523. In some embodiments, a ratio of the red effective light-emitting areas 521: the green effective light-emitting areas 522: the blue effective light-emitting areas 523 is 1:1.1:1.5-1:1.3:1.7, which may enable the light-emitting lives of all the sub-pixel openings 50 substantially same.

In some embodiments, the ratio of the red effective light-emitting area: the green effective light-emitting area: the blue effective light-emitting area is 1:1.2:1.6.

In some embodiments, shapes of orthographic projections of the filling parts 51 on the base substrate 1 are similar to shapes of orthographic projections of the sub-pixel openings 50 on the base substrate 1. For example, the orthographic projections of the sub-pixel openings 50 on the base substrate 1 are hexagonal, pentagonal, rectangular, square or circular, the orthographic projections of the filling parts 51 on the base substrate 1 are also correspondingly hexagonal, pentagonal, rectangular, square or circular.

In some embodiments, centers of the orthographic projections of the filling parts 51 on the base substrate 1 and centers of the orthographic projections of the sub-pixel openings 50 on the base substrate 1 coincide.

In some embodiments, the orthographic projections of the sub-pixel openings 50 on the base substrate 1 may be hexagonal, pentagonal, rectangular, square or circular.

In some embodiments, the filling parts 51 and the pixel defining layer 5 are disposed on a same layer, and materials of the filling parts 51 and a material of the pixel defining layer 5 are the same. As such, the filling parts 51 may be formed at the same time as the pixel defining layer 5 is formed, which may simplify a production process of the display substrate.

Figure 3:
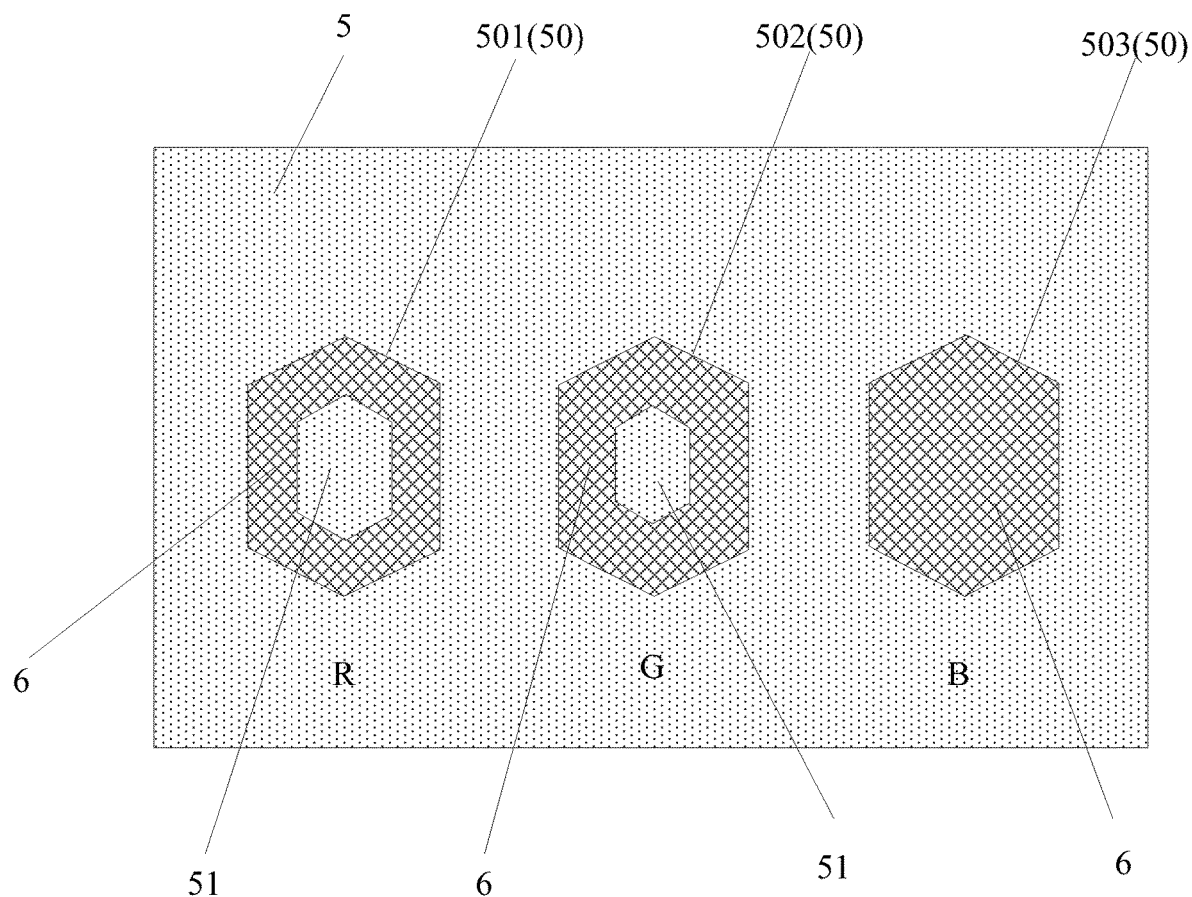
FIG. 3 is a schematic structural diagram of a top view of another array substrate provided by an embodiment of the disclosure.
Figure 4:
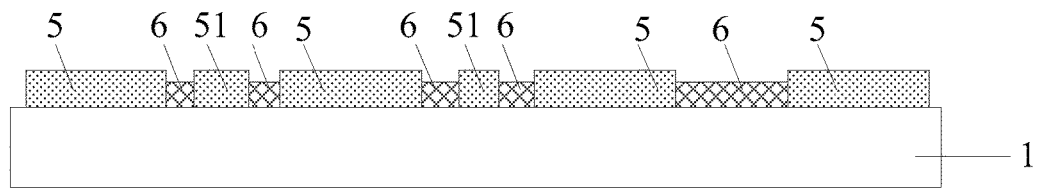
FIG. 4 is a schematic structural diagram of a section view of another array substrate provided by an embodiment of the disclosure.

In some embodiments, as shown in FIG. 3 and FIG. 4, the display substrate further includes an organic light-emitting diode layer on a side, facing away from the base substrate 1, of the pixel defining layer 5. The organic light-emitting diode layer includes organic light-emitting diode parts 6 each located in area of respective one sub-pixel opening 50 except the filling part. In some embodiments, the organic light-emitting diode parts 6 may be red light-emitting diode parts emitting red light, may also be green light-emitting diode parts emitting green light, and may also be blue light-emitting diode parts emitting blue light. In a direction perpendicular to the base substrate 1, a thickness of the organic light-emitting diode parts 6 is less than a thickness of the filling parts 51. As such, a problem of different light-emitting lives and resulting in uneven final luminance when the organic light-emitting diode parts 6 cover the entire sub-pixel openings 50, can be avoided.

Figure 5:
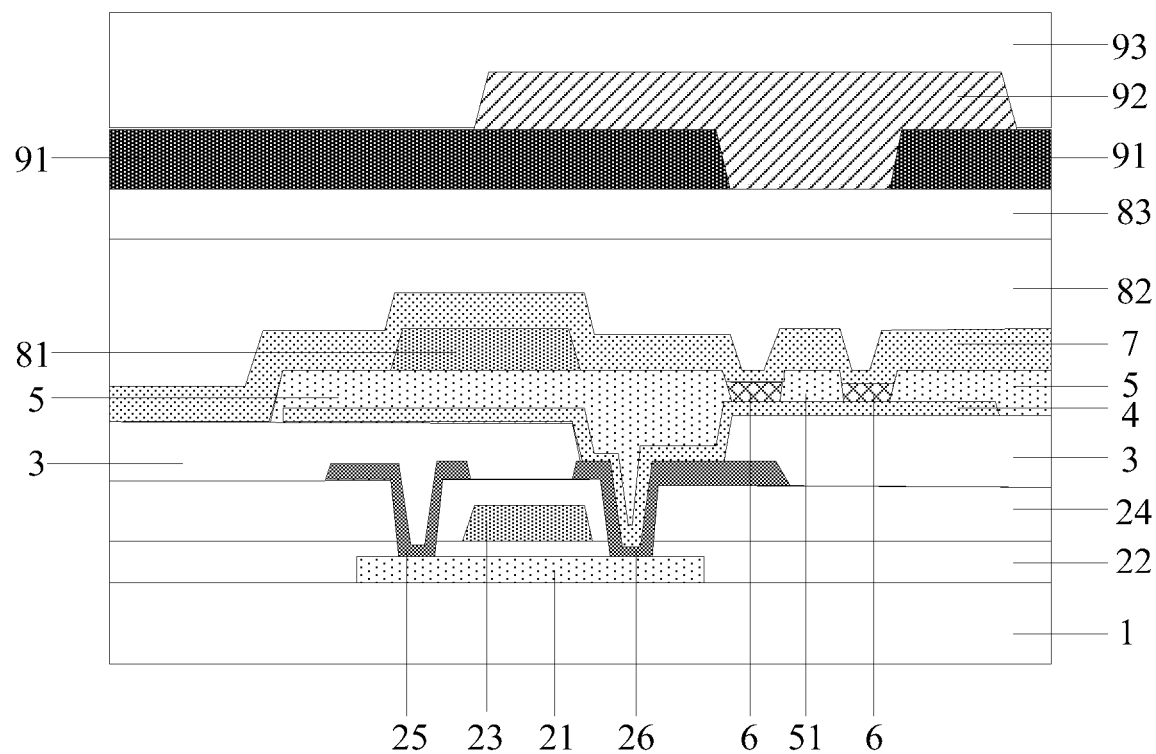
FIG. 5 is a schematic structural diagram of a detailed section view of an array substrate provided by an embodiment of the disclosure.

In some embodiments, as shown in FIG. 5, the display substrate further includes an encapsulation layer disposed on a side, facing away from the pixel defining layer, of the organic light-emitting diode layer 6. In some embodiments, the encapsulation layer may include a first inorganic encapsulation layer 82 and an organic encapsulation layer 83 located on a side, facing away from the organic light-emitting diode layer 6, of the first inorganic encapsulation layer 82 (in some embodiments, the encapsulation layer may further include a second inorganic encapsulation layer located on a side, facing away from the first inorganic encapsulation layer 82, of the organic encapsulation layer 83 (not shown in the drawing). A film layer structure of the encapsulation layer may also be in other forms. For example, it only includes the first inorganic encapsulation layer 82 and the organic encapsulation layer 83 (the disclosure is limited thereto), and a color film layer located on a side, facing away from the organic light-emitting diode layer 6, of the encapsulation layer. The color film layer is provided with color film parts 92 corresponding to the sub-pixel openings 50, and outer contour shapes of the color film parts 92 are similar to the outer contour shapes of the sub-pixel openings 50. In the embodiment of the disclosure, the outer contour shapes of the color film parts 92 are similar to the outer contour shapes of the sub-pixel openings 50, and a color display may be realized.

In some embodiments, as shown in FIG. 5, a driving layer may be further disposed between the base substrate 1 and the pixel defining layer 5. The driving layer may include an active layer 21, a first insulation layer 22, a gate layer 23, a second insulation layer 24, a source and drain layer (in some embodiments it may include a source electrode 25 and a drain electrode 26) and a planarization layer 3 located on a side of the base substrate 1.

In some embodiments, an anode layer 4 may be provided between the driving layer and the pixel defining layer 5.

In some embodiments, a cathode layer 7 may be provided between the pixel defining layer 5 and the inorganic encapsulation layer 82.

In some embodiments, a black matrix layer 91 may be provided between the color film layer 92 and the organic encapsulation layer 83.

In some embodiments, a protective layer 93 may be provided on a side, facing away from the black matrix layer 91, of the color film layer 92.

Based on a same idea of the disclosure, the embodiment of the disclosure further provides an organic light-emitting diode display panel, including the display substrate according to the embodiments of the disclosure.

Based on a same idea of the disclosure, the embodiment of the disclosure further provides a display device, including the organic light-emitting diode display panel according to the embodiment of the disclosure.

The embodiments of the disclosure have following beneficial effects: in the embodiments of the disclosure, the pixel defining layer 5 is provided with the plurality of sub-pixel openings 50, and the outer contour shapes and the sizes of all the sub-pixel openings 50 are the same, so the phenomenon that when the sizes and the shapes of the sub-pixel openings 50 are different, the light enters through the sub-pixel openings 50 and is reflected by the lower film layer, and then diffracts through the sub-pixel openings 50 again, resulting in color separation may be improved; in addition, the filling parts 51 are arranged in at least parts of the sub-pixel openings 50, and for different sub-pixel openings 50, the area ratios of the filling parts 51 to the sub-pixel openings 50 are different, so corresponding color separation improvement may be carried out under the condition of keeping the life compensation effect without affecting normal light emitting of the pixels with different light-emitting colors.

It is obvious that those of skill in the art may make various modifications and variations of the disclosure without leaving the spirit and scope of the disclosure. Thus, if such modifications and variations of the disclosure fall within the scope of the claims of the disclosure and their equivalents, the disclosure is also intended to include such modifications and variations.

What is claimed is:

1. A display substrate, comprising:
a base substrate; and
a pixel defining layer on a side of the base substrate;
wherein the pixel defining layer is provided with a plurality of sub-pixel openings;
outer contour shapes and sizes of all the plurality of sub-pixel openings are same;
filling parts are provided inside at least parts of the plurality of sub-pixel openings; and
for different sub-pixel openings, area ratios of filling part to sub-pixel opening are different;
wherein an orthographic projection of a filling part inside a sub-pixel opening on the base substrate is located in a center area of the sub-pixel opening.

2. The display substrate according to claim 1, wherein for the different sub-pixel openings, the area ratios are positively correlated with emitted light wavelengths corresponding to the sub-pixel openings.

3. The display substrate according to claim 2, wherein the plurality of sub-pixel openings comprise red sub-pixel openings, green sub-pixel openings and blue sub-pixel openings, and the red sub-pixel openings and the green sub-pixel openings are provided with the filling parts inside.

4. The display substrate according to claim 3, wherein an area in the red sub-pixel opening except the filling part serves as a red effective light-emitting area, an area in the green sub-pixel opening except the filling part serves as a green effective light-emitting area, and the blue sub-pixel opening serves as a blue effective light-emitting area; and
a ratio of the red effective light-emitting area: the green effective light-emitting area: the blue effective light-emitting area is 1:1.1:1.5-1:1.3:1.7.

5. The display substrate according to claim 4, wherein the ratio of the red effective light-emitting area: the green effective light-emitting area: the blue effective light-emitting area is 1:1.2:1.6.

6. The display substrate according to claim 1, wherein a shape of the orthographic projection of the filling part inside the sub-pixel opening on the base substrate is similar to a shape of an orthographic projection of the sub-pixel opening on the base substrate.

7. The display substrate according to claim 6, wherein a center of the orthographic projection of the filling part inside the sub-pixel opening on the base substrate and a center of the orthographic projection of the sub-pixel opening on the base substrate coincide.

8. The display substrate according to claim 6, wherein the orthographic projection of the sub-pixel opening on the base substrate is hexagonal, pentagonal, rectangular, square or circular.

9. The display substrate according to claim 1, wherein the filling parts and the pixel defining layer are in a same layer, and materials of the filling parts and a material of the pixel defining layer are same.

10. The display substrate according to claim 1, wherein the display substrate further comprises an organic light-emitting diode layer disposed on a side, facing away from the base substrate, of the pixel defining layer, and the organic light-emitting diode layer comprises organic light-emitting diode parts located in areas of respective sub-pixel openings except the filling parts; and in a direction perpendicular to the base substrate, a thickness of the organic light-emitting diode parts is less than a thickness of the filling parts.

11. The display substrate according to claim 10, wherein the display substrate further comprises:
an encapsulation layer on a side, facing away from the pixel defining layer, of the organic light-emitting diode layer; and
a color film layer on a side, facing away from the organic light-emitting diode layer, of the encapsulation layer;
wherein the color film layer comprises color film parts corresponding to the respective sub-pixel openings, and outer contour shapes of the color film parts are similar to the outer contour shapes of the sub-pixel openings.

12. An organic light-emitting diode display panel, comprising a display substrate, wherein the display substrate comprises:
a base substrate; and
a pixel defining layer on a side of the base substrate;
wherein the pixel defining layer is provided with a plurality of sub-pixel openings;
outer contour shapes and sizes of all the plurality of sub-pixel openings are same;
filling parts are provided inside at least parts of the plurality of sub-pixel openings; and
for different sub-pixel openings, area ratios of filling part to sub-pixel opening are different;
wherein an orthographic projection of a filling part inside a sub-pixel opening on the base substrate is located in a center area of the sub-pixel opening.

13. The organic light-emitting diode display panel according to claim 12, wherein for the different sub-pixel openings, the area ratios are positively correlated with emitted light wavelengths corresponding to the sub-pixel openings.

14. The organic light-emitting diode display panel according to claim 13, wherein the plurality of sub-pixel openings comprise red sub-pixel openings, green sub-pixel openings and blue sub-pixel openings, and the red sub-pixel openings and the green sub-pixel openings are provided with the filling parts inside.

15. The organic light-emitting diode display panel according to claim 14, wherein an area in the red sub-pixel opening except the filling part serves as a red effective light-emitting area, an area in the green sub-pixel opening except the filling part serves as a green effective light-emitting area, and the blue sub-pixel opening serves as a blue effective light-emitting area; and
a ratio of the red effective light-emitting area: the green effective light-emitting area: the blue effective light-emitting area is 1:1.1:1.5-1:1.3:1.7.

16. The organic light-emitting diode display panel according to claim 15, wherein the ratio of the red effective light-emitting area: the green effective light-emitting area: the blue effective light-emitting area is 1:1.2:1.6.

17. The organic light-emitting diode display panel according to claim 12, wherein a shape of the orthographic projection of the filling part inside the sub-pixel opening on the base substrate is similar to a shape of an orthographic projection of the sub-pixel opening on the base substrate.

18. The organic light-emitting diode display panel according to claim 16, wherein a center of the orthographic projection of the filling part inside the sub-pixel opening on the base substrate and a center of the orthographic projection of the sub-pixel opening on the base substrate coincide.

19. The organic light-emitting diode display panel according to claim 17, wherein the orthographic projection of the sub-pixel opening on the base substrate is hexagonal, pentagonal, rectangular, square or circular.

20. A display device, comprising the organic light-emitting diode display panel according to claim 12.

* * * * *